(12) United States Patent
Lu et al.

(10) Patent No.: US 10,700,410 B2
(45) Date of Patent: Jun. 30, 2020

(54) ANTENNA-IN-PACKAGE WITH BETTER ANTENNA PERFORMANCE

(71) Applicant: MEDIATEK INC., Hsin-Chu (TW)

(72) Inventors: Yen-Ju Lu, Hsin-Chu (TW);
Wen-Chou Wu, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/145,108

(22) Filed: Sep. 27, 2018

(65) Prior Publication Data

US 2019/0131690 A1 May 2, 2019

Related U.S. Application Data

(60) Provisional application No. 62/577,747, filed on Oct. 27, 2017.

(51) Int. Cl.
*H01L 23/34* (2006.01)
*H01Q 1/22* (2006.01)
(Continued)

(52) U.S. Cl.
CPC ........... *H01Q 1/2283* (2013.01); *H01L 23/28* (2013.01); *H01L 23/528* (2013.01);
(Continued)

(58) Field of Classification Search
CPC ...... H01Q 1/2283; H01Q 21/062; H01Q 9/26; H01Q 21/12; H01Q 1/525; H01Q 1/48;
(Continued)

(56) References Cited

U.S. PATENT DOCUMENTS 6,770,955 B1 * 8/2004 Coccioli ............ H01L 23/3128
257/659
7,119,745 B2 * 10/2006 Gaucher .................. H01Q 9/26
343/700 MS
(Continued)

FOREIGN PATENT DOCUMENTS

TW 200735320 9/2007
TW 201725693 A 7/2017
(Continued)

OTHER PUBLICATIONS

Stefan Beer et al., A 122 GHz four Element Patch Array fed by Electromagnetic Coupling, 2012 IEEE, XP032264451, Sep. 18, 2012.
(Continued)

*Primary Examiner* — Ismail A Muse
(74) *Attorney, Agent, or Firm* — Winston Hsu

(57) ABSTRACT

An Antenna-in-Package (AiP) includes an interface layer, an integrated circuit die disposed on the interface layer, a molding compound disposed on the interface layer and encapsulating the integrated circuit die, and a plurality of solder balls disposed on a bottom surface of the interface layer. The interface layer includes an antenna layer, and an insulating layer between the antenna layer and the ground reflector layer. The antenna layer includes a first antenna region and a second antenna region spaced apart from the first antenna region. The integrated circuit die is interposed between the first antenna region and the second antenna region. The first antenna region is disposed adjacent to a first edge of the integrated circuit die, and the second antenna region is disposed adjacent to a second edge of the integrated circuit die, which is opposite to the first edge.

18 Claims, 5 Drawing Sheets

(51) Int. Cl.

| | | |
|---|---|---|
| *H01Q 1/48* | (2006.01) | |
| *H01Q 1/52* | (2006.01) | |
| *H01Q 21/12* | (2006.01) | |
| *H01Q 9/26* | (2006.01) | |
| *H01Q 21/06* | (2006.01) | |
| *H01L 23/28* | (2006.01) | |
| *H01L 23/528* | (2006.01) | |
| *H01L 23/64* | (2006.01) | |
| *H01L 23/66* | (2006.01) | |

(52) U.S. Cl.
CPC ............ *H01L 23/645* (2013.01); *H01L 23/66* (2013.01); *H01Q 1/48* (2013.01); *H01Q 1/525* (2013.01); *H01Q 9/26* (2013.01); *H01Q 21/062* (2013.01); *H01Q 21/12* (2013.01); *H01L 2223/6677* (2013.01)

(58) Field of Classification Search
CPC ..... H01L 23/66; H01L 23/645; H01L 23/528; H01L 23/28; H01L 2223/6677
See application file for complete search history.

(56) References Cited

U.S. PATENT DOCUMENTS

| | | | | |
|---|---|---|---|---|
| 7,692,590 B2* | 4/2010 | Floyd | ................ | H01Q 1/38 343/700 MS |
| 7,696,930 B2* | 4/2010 | Akkermans | ...... | G06K 19/07749 343/700 MS |
| 10,270,172 B2* | 4/2019 | Liu | ................ | H01Q 9/0407 |
| 10,408,919 B2* | 9/2019 | Trotta | ................ | H01Q 19/30 |
| 2007/0013599 A1* | 1/2007 | Gaucher | ................ | H01Q 9/26 343/795 |
| 2010/0219513 A1 | 9/2010 | Zhang | | |
| 2011/0284641 A1* | 11/2011 | Yang | ................ | G06K 19/07786 235/492 |
| 2013/0141284 A1* | 6/2013 | Jeong | ................ | H01Q 1/38 343/700 MS |
| 2013/0241059 A1* | 9/2013 | Boeck | ................ | H01L 23/49816 257/738 |
| 2016/0020524 A1 | 1/2016 | Carpentier | | |
| 2016/0218072 A1* | 7/2016 | Liao | ................ | H01L 23/66 |
| 2017/0317418 A1* | 11/2017 | Garcia | ................ | H01Q 9/0407 |
| 2019/0089038 A1* | 3/2019 | Liao | ................ | H01Q 9/0407 |
| 2019/0103680 A1* | 4/2019 | Liao | ................ | H01Q 21/005 |
| 2019/0386376 A1* | 12/2019 | Kato | ................ | H04B 5/02 |
| 2020/0052374 A1* | 2/2020 | Charvat | ................ | H04W 64/003 |

FOREIGN PATENT DOCUMENTS

| | | |
|---|---|---|
| WO | 02/093685 A1 | 11/2002 |
| WO | 2006/135643 A1 | 12/2006 |

OTHER PUBLICATIONS

Thomas Zwick et al., Broadband Planar Superstrate Antenna for Integrated Millimeterwave Transceivers, IEEE Transaction on Antennas and Propagation, vol. 54, No. 10, Oct. 2006, IEEE, XP001545348, pp. 2790-2796.

* cited by examiner

ANTENNA-IN-PACKAGE WITH BETTER ANTENNA PERFORMANCE

CROSS REFERENCE TO RELATED APPLICATIONS

This application claims priority from U.S. provisional application No. 62/577,747 filed Oct. 27, 2017, the subject matter of which is hereby incorporated by reference.

BACKGROUND

This disclosure relates generally to the field of a semiconductor packaging and, more particularly, to an improved Antenna-in-Package (AiP) with better antenna performance and better isolation between the transmit (Tx) antenna and the receive (Rx) antenna.

Millimeter-wave (mmW) automotive radar systems are a key technology for future adaptive cruise control systems. With an increased awareness and interest in safety issues on vehicular transportation, a variety of obstacle detectors has been researched and developed, among which a forward looking automotive radar has received special attention as it is considered to be an essential element to complete a vehicular safety system.

In contrast to infrared or laser-based sensors, the major advantage of a mmW radar system is its excellent performance under adverse weather conditions. Thus, demand for low-cost W-band components has continued to increase, leading to a commercial success of automotive radar systems.

As known in the art, integration of antenna into a chip package has been fulfilled by adopting the embedded wafer level ball grid array (eWLB) or Antenna-in-Package (AiP) technology. However, there is still a constant need in this industry to provide an AiP with better antenna performance and efficiency.

SUMMARY

The main object of the present invention is to provide an improved Antenna-in-Package (AiP) with better antenna performance and better isolation between the transmit (Tx) antenna and the receive (Rx) antenna.

According to one aspect of the invention, an Antenna-in-Package (AiP) includes an interface layer, an integrated circuit die disposed on the interface layer, a molding compound disposed on the interface layer and encapsulating the integrated circuit die, and a plurality of solder balls disposed on a bottom surface of the interface layer. The interface layer includes an antenna layer, a ground reflector layer under the antenna layer, and an insulating layer between the antenna layer and the ground reflector layer. The antenna layer includes a first antenna region and a second antenna region spaced apart from the first antenna region. The integrated circuit die is interposed between the first antenna region and the second antenna region. The first antenna region is disposed adjacent to a first edge of the integrated circuit die, and the second antenna region is disposed adjacent to a second edge of the integrated circuit die, which is opposite to the first edge.

According to some embodiments, the first antenna region is used for transmitting signals and the second antenna region is used for receiving signals.

According to some embodiments, the interface layer comprises a substrate, an interconnection structure, a redistribution layer (RDL) structure, or an interposer substrate.

According to some embodiments, the antenna layer and the ground reflector layer are formed in two different metal layers, respectively, which are in different horizontal planes.

According to some embodiments, the integrated circuit die comprises an integrated circuit silicon die or a semiconductor chip that comprises relative functional circuits for transmitting and receiving millimeter-wave (mmW) or radio-frequency (RF) signals.

According to some embodiments, the first antenna region comprises a first antenna element, a second antenna element extending along a first direction, a feeding network electrically connecting the first antenna element and the second antenna element to the integrated circuit die.

According to some embodiments, the first antenna element is disposed relatively farther away from the integrated circuit die and the second antenna element is disposed relatively closer to the integrated circuit die.

According to some embodiments, the first antenna element and the second antenna element are two folded dipole antenna elements arranged in parallel with each other.

According to some embodiments, the feeding network, the first antenna element, and the second antenna element are coplanar.

According to some embodiments, the feeding network comprises two parallel feed lines.

According to some embodiments, the feeding network is divided into two integral portions: a longitudinal portion extending along a second direction and a lateral portion extending along the first direction.

According to some embodiments, two distal ends of the longitudinal portion are electrically coupled to the first antenna element and the second antenna element, respectively.

According to some embodiments, the lateral portion is integrally connected to the longitudinal portion and is electrically coupled to the integrated circuit die.

According to some embodiments, a distance $L_1$ between the first antenna element and the lateral portion of the feeding network is greater than a distance $L_2$ between the second antenna element and the lateral portion of the feeding network.

According to some embodiments, a difference between $L_1$ and $L_2$ ($L_1$-$L_2$) is approximately equal to a half wavelength $\lambda_g$, wherein $\lambda_g$ is the guided wavelength of electromagnetic radiation transmitted via the antenna layer.

According to some embodiments, the second antenna region has a layout that is mirror symmetric to a layout of the first antenna region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "die", "chip", "semiconductor chip", and "semiconductor die" are used interchangeable throughout the specification to mean integrated circuit chip or die. The term "horizontal" as used herein may be defined as a direction parallel to a plane or surface (e.g., surface of a substrate or a stage), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane.

The present disclosure pertains to an improved Antenna-in-Package (AiP) with better isolation between the transmit (Tx) antenna and the receive (Rx) antenna, which is particularly suited for mmW radar applications such as 77 GHz or 79 GHz car radar systems for adaptive cruise control, or other automotive radar applications.

For illustrative purposes, exemplary embodiments of the disclosure will be described with particular reference to folded dipole antenna elements and configuration of such elements in Antenna-in-Package (AiP). It is to be understood, however, that the present invention is not limited to any particular antenna type or operating frequency. Instead, the invention is more generally applicable to any antenna type that is suitable for a given application and/or frequency of operation to provide a high bandwidth and efficiency product antenna.

Figure 1:
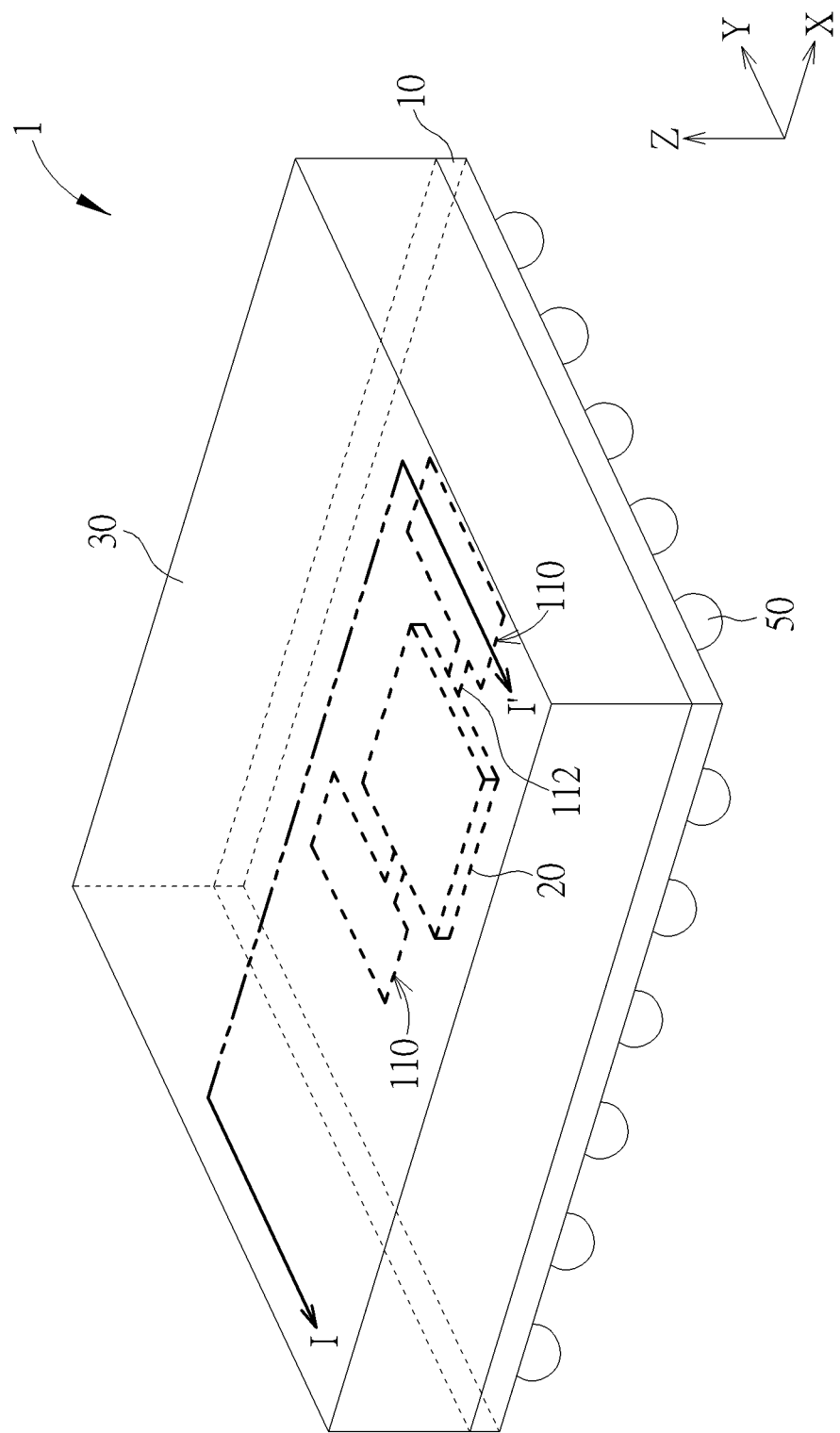
FIG. 1 is a schematic, perspective diagram of an exemplary Antenna-in-Package (AiP) according to one embodiment of the invention.
Figure 2:
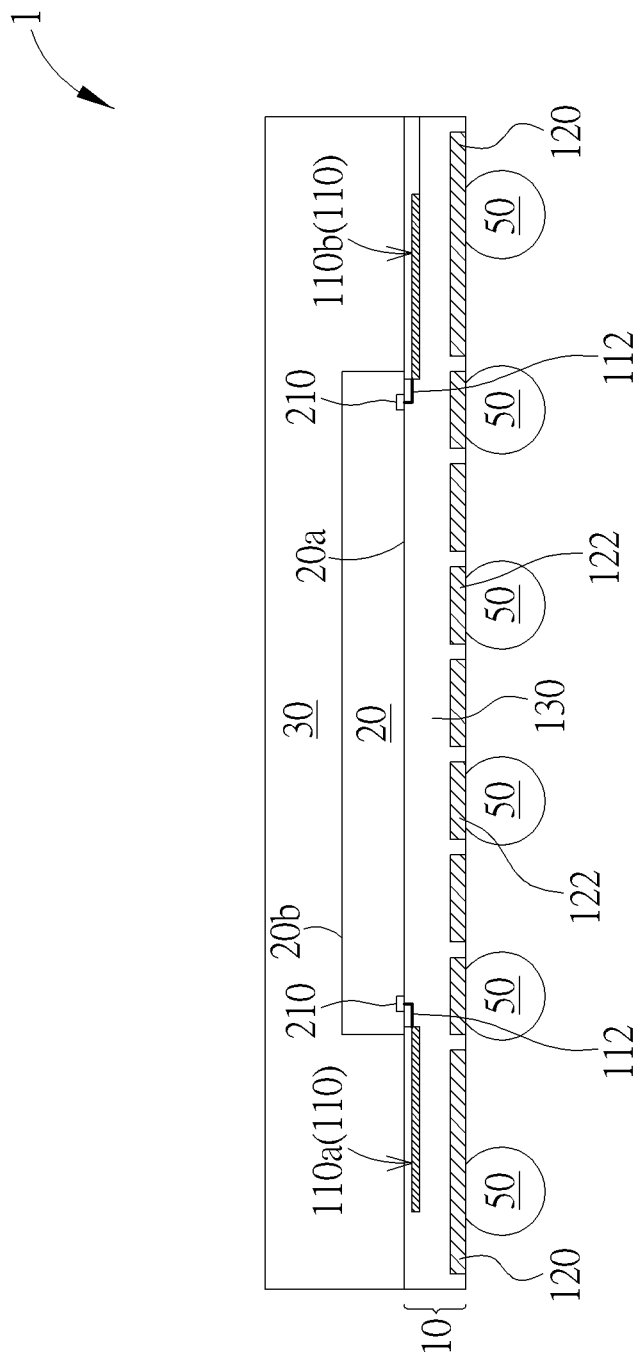
FIG. 2 is a schematic, cross-sectional view taken along line I-I' in FIG. 1.

Please refer to FIG. 1 and FIG. 2. FIG. 1 is a schematic, perspective diagram of an exemplary Antenna-in-Package (AiP) according to one embodiment of the invention. FIG. 2 is a schematic, cross-sectional view taken along line I-I' in FIG. 1.

As shown in FIG. 1 and FIG. 2, according to one embodiment, an Antenna-in-Package (AiP) 1 comprises an interface layer 10, an integrated circuit die 20 (shown in phantom in FIG. 1) such as a radio-frequency (RF) die disposed on the interface layer 10, a molding compound 30 that is disposed on the interface layer 10 and encapsulates the integrated circuit die 20, and a plurality of solder balls 50 disposed on a bottom surface of the interface layer 10. Through the solder balls 50, the interface layer 10 electrically connects the integrated circuit die 20 with an external circuit board (not shown) such as a printed circuit board (PCB). It is understood that the interface layer 10 may comprise a substrate, an interconnection structure, a redistribution layer (RDL) structure, an interposer substrate or the like.

According to one embodiment of the invention, the interface layer 10 may comprise at least an antenna layer 110, a ground reflector layer 120 under the antenna layer 110, and an insulating layer 130 between the antenna layer 110 and the ground reflector layer 120. The interface layer 10 may further comprise a plurality of ball pads 122 for attaching the solder balls 50. According to one embodiment of the invention, the ball pads 122 and the ground reflector layer 120 are coplanar and are formed in the same metal layer of the interface layer 10.

Figure 5:
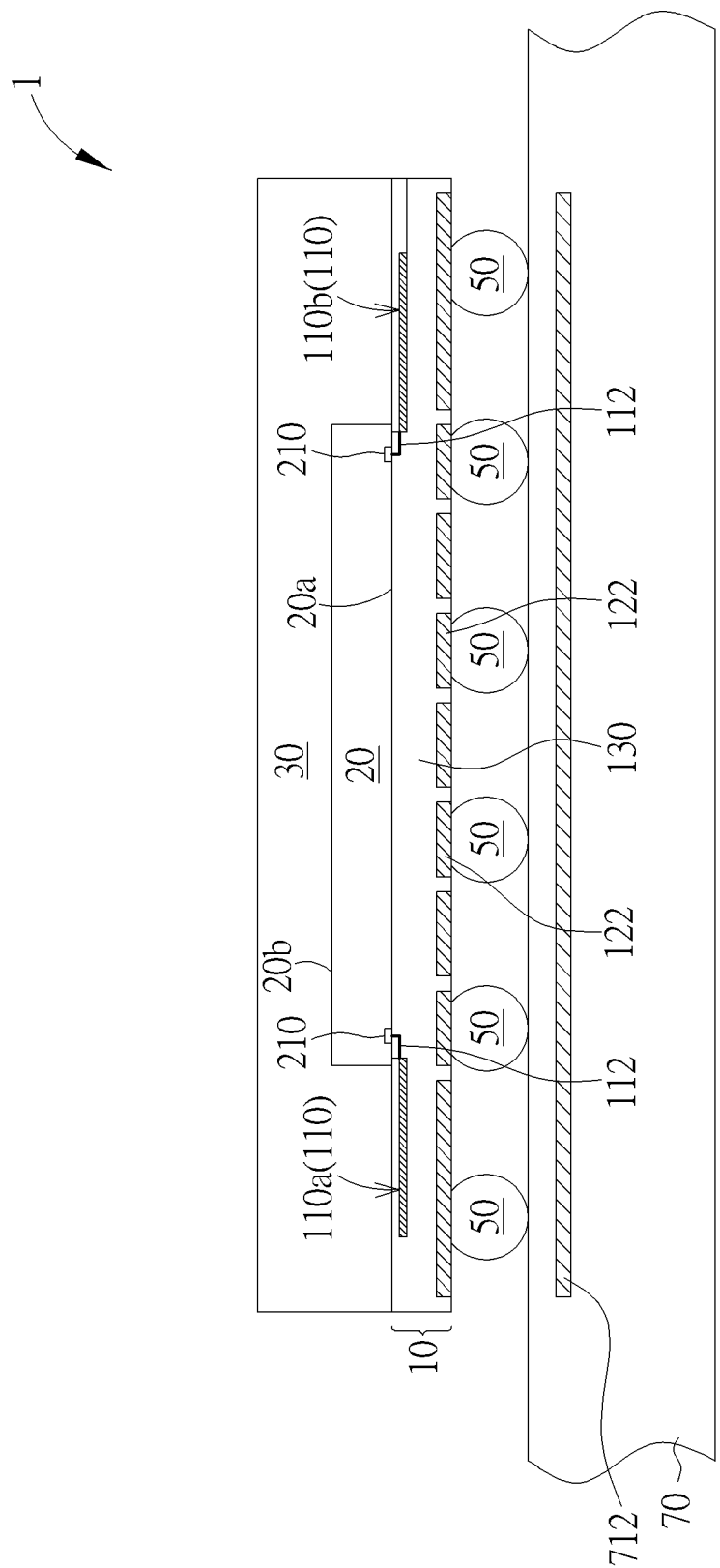
FIG. 5 is a schematic, cross-sectional diagram showing that a ground reflector layer is disposed in a printed circuit board according to another embodiment of the invention.

However, it is to be understood that in other embodiments the aforesaid ground reflector layer may be disposed within a printed circuit board. As shown in FIG. 5, the ground reflector layer 712 is disposed in a printed circuit board 70. The ground reflector layer 712 is disposed directly under the antenna layer 110 and may completely overlap with the antenna layer 110.

According to one embodiment of the invention, the antenna layer 110 and the ground reflector layer 120 are formed in two different metal layers (e.g., copper layers). The two metal layers are in different horizontal planes. For example, the interface layer 10 may have an upper surface that is adjacent to the integrated circuit die 20 and a lower surface opposite to the upper surface. The antenna layer 110 may be formed at the upper surface and may be electrically connected to the integrated circuit die 20 through an interconnect line or a trace 112. Although not shown in the figures, it is to be understood that the metal layers in the interface layer 10 may be interconnected through conductive vias if necessary.

The ground reflector layer 120, which may be electrically connected to a ground plane of a printed circuit board (PCB), may be formed at the lower surface of the interface layer 10. The ground reflector layer 120 may limit the antenna radiation to the upper hemisphere above the antenna layer 110. According to one embodiment of the invention, the ground reflector layer 120 may be a solid metal layer such as a solid copper layer, which completely overlaps with the antenna layer 110 when viewed from the above.

According to one embodiment of the invention, the integrated circuit die 20 may be an integrated circuit silicon die or a semiconductor chip that comprises relative functional circuits for transmitting and/or receiving mmW or RF signals. According to one embodiment of the invention, the integrated circuit die 20 may have an active surface 20a and a passive surface 20b that is opposite to the active surface 20a. A plurality of input/output (I/O) pads 210 may be disposed on the active surface 10a. According to one embodiment of the invention, the active surface 10a of the integrated circuit die 20 may be integrally joined with the upper surface of the interface layer 10. The antenna layer 110 may be electrically connected to respective I/O pads 210 on the active surface 20a of the integrated circuit die 20 through the interconnect or the trace 122.

According to one embodiment of the invention, the molding compound 30 may comprise organic resin typically used in the encapsulation of integrated circuit devices and selected for low moisture permeability and low thermal coefficient of expansion to avoid exposure of the encapsulated chip to moisture or mechanical stress, respectively. For example, according to one embodiment of the invention, the molding compound 30 may comprise epoxy materials. The molding compound 30 may further comprise fillers, such as amorphous silicon oxide (silica glass) and crystalline silicon oxide (quartz) fillers. Suitable additives may be added to enhance the thermal conductivity of the molding compound 30. According to one embodiment of the invention, the molding compound 30 may have a dielectric constant k ranging between 3.3 and 3.4, for example. According to one embodiment of the invention, the molding compound 30 may have a thickness of about 0.4~1.3 mm, for example, 1.2 mm.

According to one embodiment of the invention, the semiconductor package 1 may be a fan-out wafer level package (FOWLP) and the interface layer 10 may be a re-distribution layer (RDL) structure. As known in the art, wafer level package (WLP) involves packaging the die while it is still on the wafer. Generally, WLP is a substrate-less package. Instead of a substrate, WLP utilizes a thin-film of routing layers, or redistribution layers (RDLs), which provide electrical connections in the package. WLP makes use of solder balls 50 on the bottom of the package, which connects the RDLs to a board or a printed circuit board (PCB).

Figure 3:
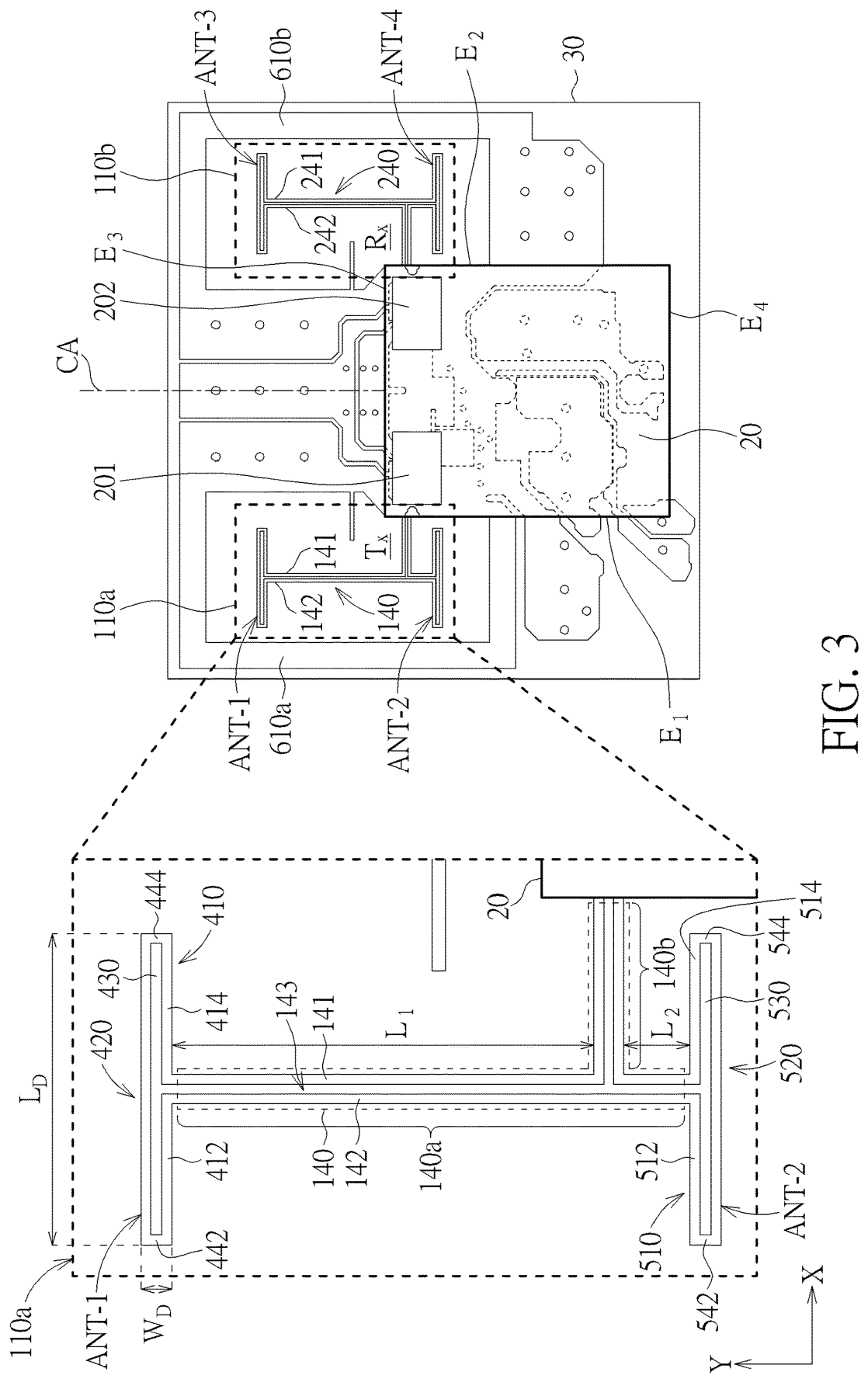
FIG. 3 is a perspective top view showing an exemplary layout of the integrated circuit die and the antenna elements in the AiP according to one embodiment of the invention.

FIG. 3 is a perspective top view showing an exemplary layout of the integrated circuit die and the antenna elements in the AiP according to one embodiment of the invention. Referring to FIG. 3, and briefly back to FIG. 2, the integrated circuit die 20 may have four edges $E_1$~$E_4$, which are encapsulated by the molding compound 30. A first antenna region 110a of the antenna layer 110 is disposed adjacent to and beyond the first edge $E_1$ of the integrated circuit die 20. A second antenna region 110b of the antenna layer 110 is disposed adjacent to and beyond the second edge $E_2$ of the integrated circuit die 20, which is opposite to the first edge $E_1$. According to one embodiment of the invention, the first antenna region 110a is used for transmitting signals and the second antenna region 110b is used for receiving signals. According to one embodiment of the invention, the integrated circuit die 20 may comprise a transmitter circuit 201 and a receiver circuit 202, which are electrically coupled to the first antenna region 110a and the second antenna region 110b, respectively.

By separating the first antenna region 110a from the second antenna region 110b with the integrated circuit die 20, the interference between the first antenna region 110a and the second antenna region 110b may be reduced, thereby providing better antenna performance and better isolation between the transmit (Tx) antenna and the receive (Rx) antenna.

As shown in the enlarged view of FIG. 3, the first antenna region 110a may comprise antenna elements ANT-1 and ANT-2 horizontally extending along a reference X-axis. According to one exemplary embodiment, the antenna elements ANT-1 and ANT-2 are two folded dipole antenna elements arranged in parallel with each other. The antenna elements ANT-1 and ANT-2 are electrically coupled to the integrated circuit die 20 via a feeding network 140 of power combine. According to one embodiment of the invention, the feeding network 140 may comprise two parallel feed lines 141 and 142. According to one embodiment of the invention, the feeding network 140 and the antenna elements ANT-1 and ANT-2 are formed in the same antenna layer 110 and are therefore coplanar.

As is known to those skilled in the art, the feeding network 140 is designed to have intrinsic impedance that can match the impedance of the antenna elements ANT-1 and ANT-2. The impedance of the feeding network 140 can be adjusted by, e.g., varying the width of the feed lines 141 and 142 and the size of a gap 143 between the feed lines 141 and 142. According to one embodiment of the invention, for example, the gap 143 may have a width of about 20-50 μm.

According to one embodiment of the invention, for example, the feed lines 141 and 142 may have a width of about 20-50 μm.

According to one embodiment of the invention, the feeding network 140 may be divided into two integral portions: a longitudinal portion 140a extending along the reference Y-axis and a lateral portion 140b extending along the reference X-axis. The two distal ends of the longitudinal portion 140a are electrically coupled to the antenna elements ANT-1 and ANT-2, respectively. The lateral portion 140b is integrally connected to the longitudinal portion 140a and is electrically coupled to the integrated circuit die 20.

According to one embodiment of the invention, the folded dipole antenna element ANT-1 comprises a first half-wavelength dipole element 410 comprising first and second quarter-wavelength elements 412 and 414 and a second half-wavelength dipole element 420, which are disposed parallel to each other and separated by a gap 430. The gap 143 of the feeding network 140 separates the first half-wavelength dipole element 410 into the first and second quarter-wavelength elements 412 and 414. The end portions of elements 412 and 414 are connected (shorted) to end portions of the second half-wavelength dipole element 420 by elements 442 and 444. The folded dipole antenna element ANT-1 has a length, denoted as $L_D$, and a width denoted as $W_D$. According to one embodiment of the invention, the length $L_D$ may range between 900 and 1300 μm, and the width $W_D$ may range between 30 um and 200 μm. The length $L_D$ and $W_D$ will vary depending on the frequency of operation and the dielectric constant of the substrate.

Likewise, the folded dipole antenna element ANT-2 comprises a first half-wavelength dipole element 510 comprising first and second quarter-wavelength elements 512 and 514 and a second half-wavelength dipole element 520, which are disposed parallel to each other and separated by a gap 530. The gap 143 of the feeding network 140 separates the first half-wavelength dipole element 510 into the first and second quarter-wavelength elements 512 and 514. The end portions of elements 512 and 514 are connected (shorted) to end portions of the second half-wavelength dipole element 520 by elements 542 and 544. According to one embodiment of the invention, the dimension (i.e. length and width) of the folded dipole antenna element ANT-2 is the same as that of the folded dipole antenna element ANT-1.

According to one embodiment of the invention, as shown in FIG. 3, the folded dipole antenna element ANT-1 is disposed relatively farther away from the integrated circuit die 20 and the folded dipole antenna element ANT-2 is disposed relatively closer to the integrated circuit die 20. The distance $L_1$ between the folded dipole antenna element ANT-1 and the lateral portion 140b of the feeding network 140 is greater than the distance $L_2$ between the folded dipole antenna element ANT-2 and the lateral portion 140b of the feeding network 140. According to one embodiment of the invention, preferably, the difference between $L_1$ and $L_2$ ($L_1$-$L_2$) is approximately equal to a half wavelength $\lambda_g$, wherein $\lambda_g$ is the guided wavelength of the electromagnetic radiation transmitted via the antenna layer 110, for example, a W-band radar, operating at 77 GHz, would have a $\lambda_g$=1~1.5 mm, wherein the substrate dielectric constant ($\varepsilon_r$) is about 3.6. By providing such configuration, the folded dipole antenna elements ANT-1 and ANT-2 can radiate in phase.

According to one embodiment of the invention, the second antenna region 110b has a layout that is mirror symmetric to the layout of the first antenna region 110a as described above, with respect to a central axis CA. The second antenna region 110b may comprise antenna elements ANT-3 (like ANT-1) and ANT-4 (like ANT-2) horizontally extending along a reference X-axis. According to one exemplary embodiment, the antenna elements ANT-3 and ANT-4 are two folded dipole antenna elements arranged in parallel with each other. The antenna elements ANT-3 and ANT-4 are electrically coupled to the integrated circuit die 20 via a feeding network 240 of power combine. According to one embodiment of the invention, the feeding network 240 may comprise two parallel feed lines 241 and 242. According to one embodiment of the invention, the feeding network 240 and the antenna elements ANT-3 and ANT-4 are formed in the same antenna layer 110 and are therefore coplanar.

It is to be understood that in other embodiments the second antenna region 110b may have a layout that is not mirror symmetric to the layout of the first antenna region 110a.

According to one embodiment of the invention, as shown in FIG. 3, to provide better Tx/Rx isolation, a first annular guard ring 610a may be provided around the first antenna region 110a, and a second annular guard ring 610b may be provided around the second antenna region 110b. The first annular guard ring 610a continuously surrounds the first antenna region 110a and the second annular guard ring 610b continuously surrounds the second antenna region 110b. The first annular guard ring 610a and the second annular guard ring 610b are coplanar with the folded dipole antenna elements ANT-1~ANT-4.

Figure 4:
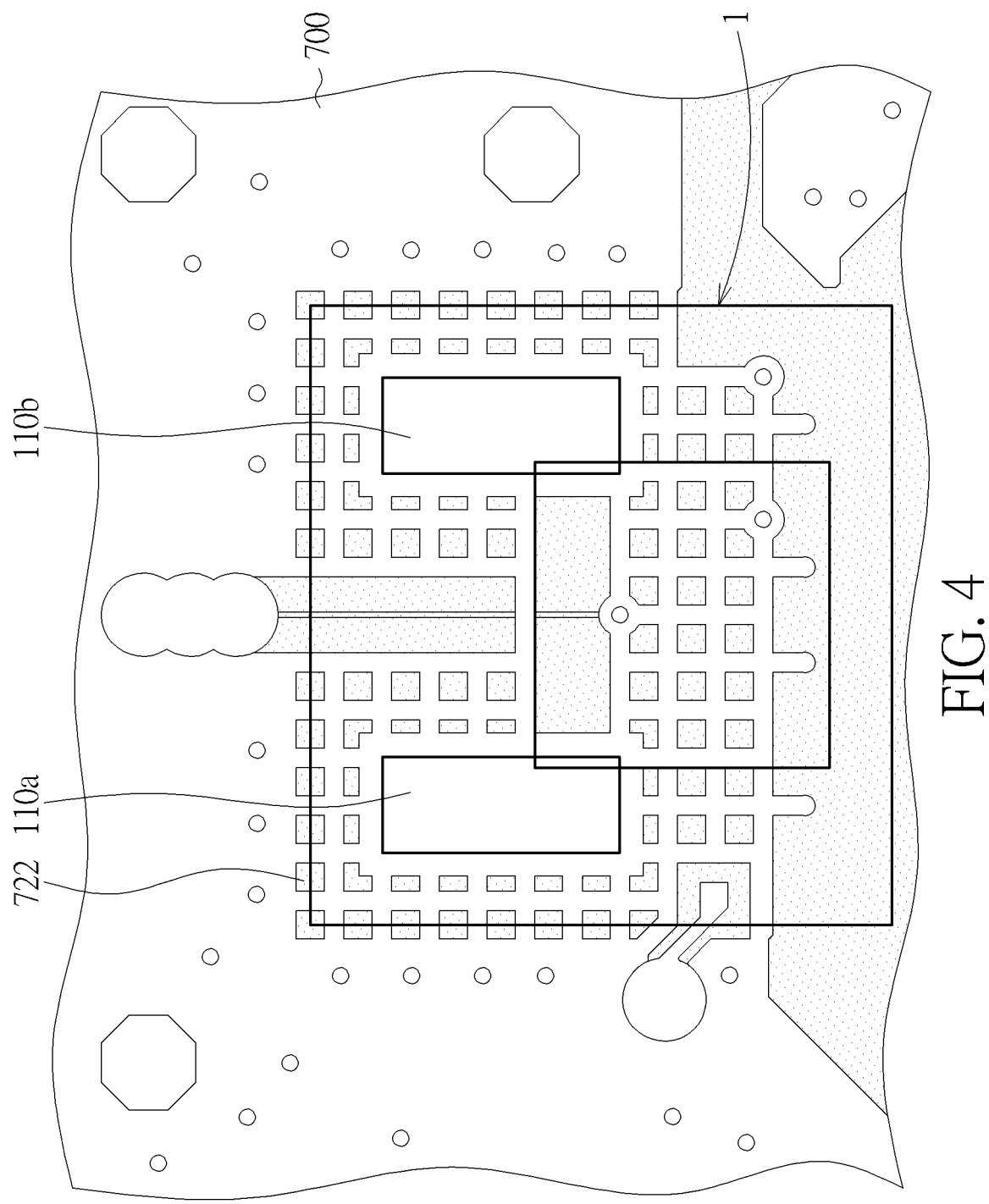
FIG. 4 is a perspective top view of the AiP mounted on a printed circuit board according to one embodiment of the invention.

Please now refer to FIG. 4. FIG. 4 is a perspective top view of the AiP mounted on a printed circuit board according to one embodiment of the invention. As shown in FIG. 4, the AiP 1 is mounted on a printed circuit board 700 by using surface mount technique (SMT) within a chip mounting area comprising a plurality of ball pads 722. It is to be understood that the layout of the ball pads 722 for the ball grid array on a printed circuit board 700 corresponds to the ball pads 122 at the bottom surface of the AiP 1. The mesh type layout of the ground ball pads 722 around the first antennal region 110a and the second antenna region 110b may provide better Tx/Rx isolation and improved SMT quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An Antenna-in-Package (AiP), comprising:
    an interface layer comprising at least an antenna layer and an insulating layer disposed under the antenna layer, wherein the antenna layer comprising a first antenna region and a second antenna region spaced apart from the first antenna region;
    an integrated circuit die disposed on the interface layer, wherein the integrated circuit die is interposed between the first antenna region and the second antenna region, wherein the first antenna region is disposed adjacent to a first edge of the integrated circuit die, and the second antenna region is disposed adjacent to a second edge of the integrated circuit die, which is opposite to the first edge, wherein the first antenna region comprises a first antenna element, a second antenna element extending along a first direction, a feeding network electrically connecting the first antenna element and the second antenna element to the integrated circuit die, wherein the feeding network, the first antenna element, and the second antenna element are coplanar; and
    a plurality of solder balls disposed on a bottom surface of the interface layer.

2. The AiP according to claim 1, wherein the first antenna region is used for transmitting signals and the second antenna region is used for receiving signals.

3. The AiP according to claim 1, wherein the interface layer comprises a substrate, an interconnection structure, a redistribution layer (RDL) structure, or an interposer substrate.

4. The AiP according to claim 1, wherein the AiP further comprises a ground reflector layer, wherein the antenna layer and the ground reflector layer are formed in two different metal layers, respectively, which are in different horizontal planes.

5. The AiP according to claim 1, wherein the integrated circuit die comprises an integrated circuit silicon die or a semiconductor chip that comprises relative functional circuits for transmitting and receiving millimeter-wave (mmW) or radio-frequency (RF) signals.

6. The AiP according to claim 1, wherein the first antenna element is disposed relatively farther away from the integrated circuit die and the second antenna element is disposed relatively closer to the integrated circuit die.

7. The AiP according to claim 1, wherein the first antenna element and the second antenna element are two folded dipole antenna elements arranged in parallel with each other.

8. The AiP according to claim 1, wherein the feeding network comprises two parallel feed lines.

9. The AiP according to claim 1, wherein the feeding network is divided into two integral portions: a longitudinal portion extending along the second direction and a lateral portion extending along the first direction.

10. The AiP according to claim 9, wherein two distal ends of the longitudinal portion are electrically coupled to the first antenna element and the second antenna element, respectively.

11. The AiP according to claim 9, wherein the lateral portion is integrally connected to the longitudinal portion and is electrically coupled to the integrated circuit die.

12. The AiP according to claim 9, wherein a distance $L_1$ between the first antenna element and the lateral portion of the feeding network is greater than a distance $L_2$ between the second antenna element and the lateral portion of the feeding network.

13. The AiP according to claim 12, wherein a difference between $L_1$ and $L_2$ is approximately equal to a half wavelength $\lambda_g$, wherein $\lambda_g$ is the guided wavelength of electromagnetic radiation transmitted via the antenna layer.

14. The AiP according to claim 1, wherein the second antenna region has a layout that is mirror symmetric to a layout of the first antenna region.

15. The AiP according to claim 1 further comprising:
    a first annular guard ring provided around the first antenna region; and
    a second annular guard ring provided around the second antenna region, wherein the first annular guard ring continuously surrounds the first antenna region and the second annular guard ring continuously surrounds the second antenna region.

16. The AiP according to claim 15, wherein first annular guard ring and the second annular guard ring are coplanar with the first and second antenna elements.

17. The AiP according to claim 1 further comprising:
    a mesh type layout of ground ball pads around the first antennal region and the second antenna region.

18. An Antenna-in-Package (AiP), comprising:
an interface layer comprising at least an antenna layer and an insulating layer disposed under the antenna layer, wherein the antenna layer comprising a first antenna region and a second antenna region spaced apart from the first antenna region;
an integrated circuit die disposed on the interface layer, wherein the integrated circuit die is interposed between the first antenna region and the second antenna region, wherein the first antenna region is disposed adjacent to a first edge of the integrated circuit die, and the second antenna region is disposed adjacent to a second edge of the integrated circuit die, which is opposite to the first edge, wherein the first antenna region comprises a first antenna element, a second antenna element extending along a first direction, a feeding network electrically connecting the first antenna element and the second antenna element to the integrated circuit die, wherein the feeding network, the first antenna element, and the second antenna element are coplanar;
a plurality of solder balls disposed on a bottom surface of the interface layer; and
a printed circuit board (PCB) comprising a ground reflector layer, wherein the interface layer disposed on the PCB via the plurality of solder balls.

* * * * *